United States Patent [19]
Odom

[11] 3,949,199
[45] Apr. 6, 1976

[54] PULSE WIDTH DECODER
[75] Inventor: James T. Odom, Huntsville, Ala.
[73] Assignee: Avco Corporation, Huntsville, Ala.
[22] Filed: Sept. 6, 1974
[21] Appl. No.: 503,743

[52] U.S. Cl. ........ 235/92 DM; 235/92 SH; 307/234; 328/111
[51] Int. Cl.² .......................................... G06M 3/00
[58] Field of Search ..................... 307/234; 328/111; 235/92 DM, 92 SH, 92 T, 92 TE:92 FQ; 324/181, 186, 187, 185

[56] References Cited
UNITED STATES PATENTS

| | | | |
|---|---|---|---|
| 2,964,657 | 12/1960 | Page | 235/92 NG |
| 3,133,189 | 5/1964 | Bagley et al. | 235/92 PE |
| 3,632,996 | 1/1972 | Paine et al. | 235/92 DE |
| 3,820,025 | 6/1974 | Lahr et al. | 324/186 |

FOREIGN PATENTS OR APPLICATIONS

| | | | |
|---|---|---|---|
| 184,341 | 11/1966 | U.S.S.R. | 324/186 |
| 189,946 | 12/1966 | U.S.S.R. | 324/186 |

OTHER PUBLICATIONS
Kintner, "ELECTRONIC DIGITAL TECHNIQUES," McGraw-Hill Book Co., 1968, pp. 188–190.
Millman & Taub, "PULSE, DIGITAL AND SWITCHING WAVEFORMS," McGraw-Hill Book Co., 1965, pp. 693, 694.

*Primary Examiner*—Thomas J. Sloyan
*Attorney, Agent, or Firm*—Charles M. Hogan

[57] ABSTRACT

Herein disclosed is a pulse width decoder comprising an oscillator activated to generate clock pulses of relatively short duration as long as an input signal pulse is applied, a shift register adapted to channelize a multiplicity of pulse widths, means including a divider counter for utilizing locally generated pulses to shift the register, and means including feedback circuitry from the shift register to the divider counter to change the divisor in the counter so that the range of window tolerance provided by the channelizing is effectively increased, in steps, with ascending groups of pulse widths. Additionally, delay means is incorporated to provide for a minimum limit of acceptable input signal pulse width.

2 Claims, 3 Drawing Figures

PULSE WIDTH DECODER

BACKGROUND OF THE INVENTION

1. Field of the Invention

The present invention is a pulse width decoder. It provides digital indications of pulse widths or durations and utilizes digital circuitry to this end.

2. Description of the Prior Art

The present invention is of particular utility in security systems such as those for the detection of fire and burglary. In systems of this kind decoding of an input signal pulse is frequently accomplished by a detector which performs a comparison between a preset reference and the width of the applied signal pulse. The input signal pulse is typically applied to a two-branch circuit. One branch provides a ramp which triggers a pulse generator when a predetermined voltage is achieved. The output of that pulse generator and a trailing pulse which is produced by a differentiating circuit in the other branch are applied to a coincidence circuit so that when that trailing pulse corresponds in time with the pulse output of the pulse generator an overall output results. That is, an overall output is produced whenever the input pulse is substantially equal in width to the preset reference. Adaptation of circuitry of this kind to the sampling of a plurality of input pulse widths involves extensive duplication of ramp circuitry and great complexity.

The prior art approach just described employs a ramp voltage and is premised on the attainment of a voltage threshold by that voltage. It will be noted that one threshold is provided. The present invention departs from the prior art by the provision of a variable divisor counter and the use of a number of successive time thresholds. Locally generated pulses are employed and provision is automatically made for an unusual range of drift of those pulses.

SUMMARY OF THE INVENTION

The principal object of the invention is to provide a novel, simplified and improved system for furnishing a digital indication of any one of a wide range of applied input signal pulse widths.

Another object of the invention is to utilize, for the mensuration of multiple pulse widths, means such as a shift register for providing a succession of time bins, thereby avoiding the complexities and duplication which have characterized the prior art.

A further object of the invention is to provide a pulse width decoding system in which tolerances (i.e., windows or acceptable ranges) are automatically adjusted, in steps, in accordance with incremental groupings of pulse widths under consideration.

BRIEF DESCRIPTION OF THE DRAWINGS

For a better understanding of the invention, together with other and further objects, advantages and capabilities thereof, reference is made to the following description of the accompanying drawings, in which.

DESCRIPTION OF THE PREFERRED EMBODIMENT OF THE INVENTION

Figure 1:
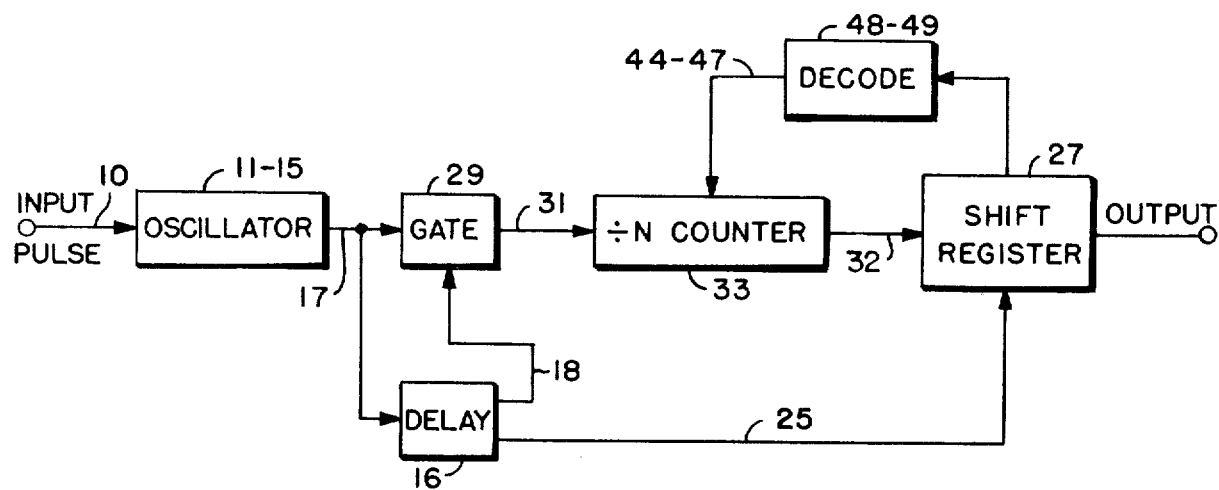
FIG. 1 is a skeleton form of block diagram used in explaining the fundamental concepts and major elements of the invention.

The invention as shown in functional form in FIG. 1 uses a pulse counting scheme to decode the input pulse width. The input signal pulse is applied at line 10 to enable the oscillator 11–15. The output of the oscillator at line 17 is applied to the input of a delay circuit 16. This delay circuit is used to set up a minimum time for the window of the signal input pulse of the narrowest acceptable width to be established. It accomplishes this by setting the first stage of shift register 27 to a high, using line 25. The output on line 18 of the delay circuit is used to enable the oscillator output at gate 29. The output from gate 29 is applied, using line 31, to a programmable divide-by-N counter 33. The divisor N and count rate are determined by the inputs 44–47. The output of the counter 33 is applied to the input 32 of a shift register 27 so that the counter 33 controls the input pulse windows by shifting a high from one stage to the next in shift register 27. Feedback from the shift register 27 to counter 33 is provided through the decode circuitry 48, 49 so that the pulse windows can be varied in width. The foregoing is a general outline of the invention. It will be understood that the shift register is one form of means for establishing a succession of time bins.

Figure 2:
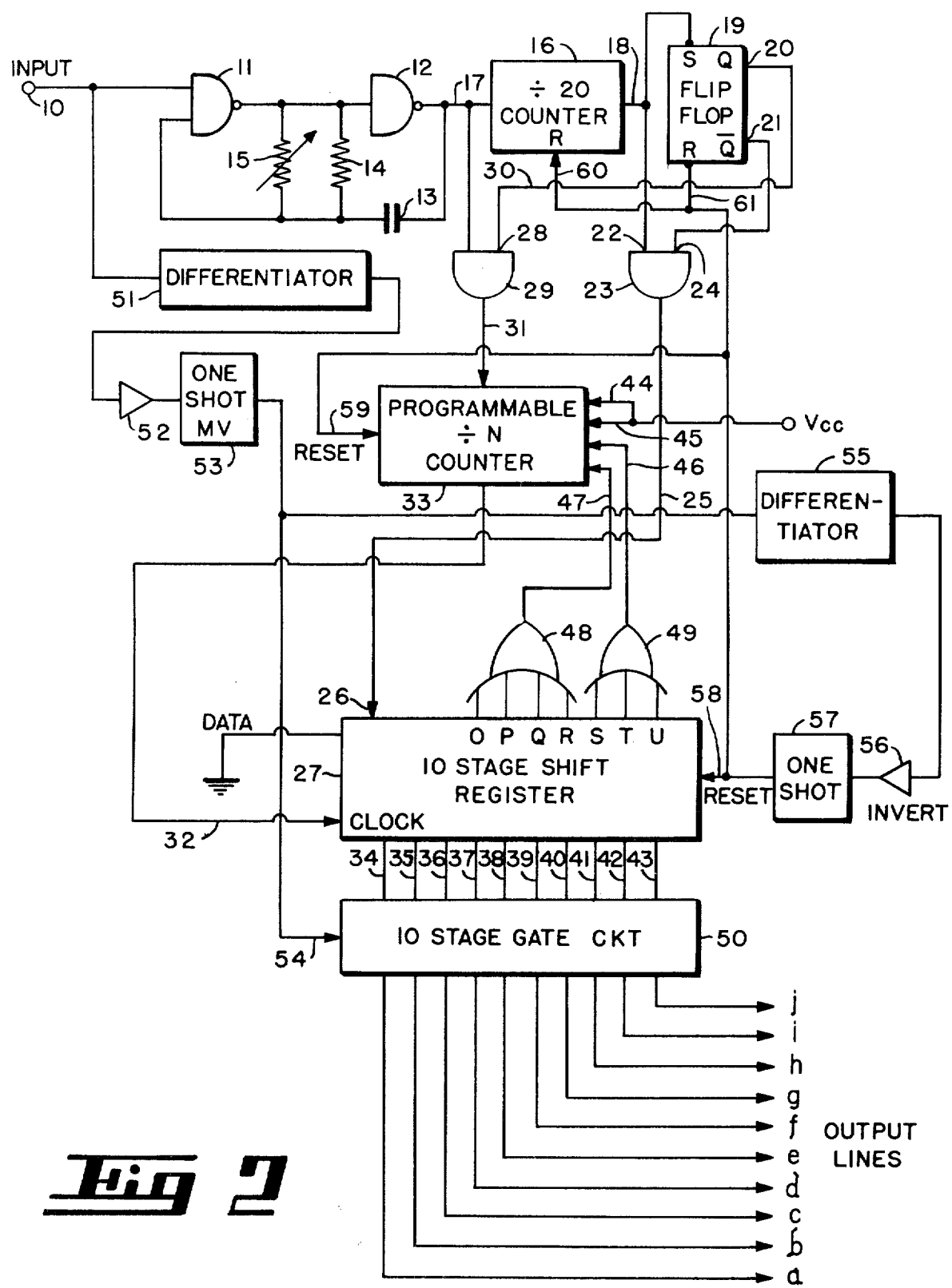
FIG. 2 is a circuit schematic, generally in block form, of a preferred embodiment of pulse width decoder in accordance with the invention.

The first function that is performed by the preferred embodiment of the invention as shown in FIG. 2 is the generation of a stream of short pulses, each having an oscillation cycle of 5 milliseconds, for example, in response to a square wave signal pulse input which may, in the example herein shown, have a period which may vary from 130 to 720 milliseconds. This function is accomplished by a conventional flip-flop multivibrator circuit. This circuit has an input line 10 to which input signal pulses are applied, and it includes a pair of NAND gates 11 and 12 intercoupled in conventional fashion by circuit elements comprising capacitor 13, fixed resistor 14 and variable resistor 15. With reference to the circuitry comprising the elements 10–15, suffice it to say that this oscillator produces a train of short pulses which train continues for the entire duration of an input signal pulse applied to input line 10.

In the specific example herein shown the embodiment does not respond to pulses having a width of less than 100 milliseconds. Therefore I provide circuitry which performs the function of establishing a 100 millisecond delay at the initiation of operations, so that pulses having a width which is less than that delay period are disregarded. It will of course be understood that all of the parameters herein mentioned are illustrative and are provided for purposes of exposition and not of limitation. For example, the 100 millisecond delay herein mentioned is only a suggested parameter, which we have found to be suitable in one successful working embodiment of the invention. The same is true of the other parameters herein mentioned.

The 100 millisecond delay is provided by a divide-by-20 counter 16 which has an input line 17 coupled to the output of the oscillator circuit just described. The operation of the counter circuit 16 is such that when 20 output pulses have been generated by the oscillator, then a pulse will appear at the output line 18 of counter 16. This pulse is utilized, broadly speaking, to initiate pulse width determinations. The output of counter 16 is coupled to the set input line of flip-flop 19, which has two outputs 20 and 21. The output of counter 16 is also coupled to input 22 of AND gate 23. The other input 24 of AND gate 23 is connected to output 21 of flip-flop 19. AND gate 23 has an output 25 which is coupled to the set input 26 of shift register 27. The operation of this circuitry is such that, in response to 1's on both inputs of AND gate 23 there will be an output on line 25 which sets the shift register 27, assuring that the shift register 27 will be set only in response to the application at 10 of an input signal pulse having a width at least equal to 100 milliseconds.

The output of the counter 16 at 18 also causes output 20 of gate 19 to go high to a 1 state. This output, as applied to input 28 of gate 29 via line 30, enables AND gate 29 so that the 5 milliseconds cycle oscillator pulses appearing on line 17 pass through gate 29 and appear at its output 31.

It has been noted that in response to a pulse on line 18 output 20 of gate 19 goes high. Output 21 then goes low but the transition is delayed for a short interval such that AND gate 23 is satisfied and shift register 27 is set before the transition of 21 to the low state occurs. It will be seen that the flip-flop 19 and the AND gates 23 and 29 and the lines 25 and 30 are provided primarily for the purpose of assuring that the start of operations of the shift register is delayed by the requisite amount, 100 milliseconds in the specific embodiment herein shown.

Attention is now invited to the shift register 27, the locally generated pulse input line 32 thereto, the divide-by-N counter 33, and the input line 31 thereto. Once the gate 29 is enabled the period of oscillation of the pulses appearing on line 31 will be 5 milliseconds. This line is coupled to the input of the counter 33 which has an output 32. Therefore there will appear at the output line 32 pulses having a period of oscillation equal to the product of N and 5 milliseconds. In accordance with one aspect of the invention N is made to be adjustable.

From the foregoing description there will be seen that, assuming N to be 12, a pulse will appear on output line 32 60 milliseconds following the application of the set pulse to the shift register at 26. In other words, 60 milliseconds after the start of operation the output of register 27 shifts from its output line 34 to its output line 35. In other words, for every twelfth pulse appearing on line 31 a pulse appears on line 32.

It will be seen from the foregoing that the invention operates in such a manner that a window extending from 100 to 160 milliseconds is provided for an expected signal input pulse width approximating 130 milliseconds. The window provided by the first stage extends for 30 milliseconds on each side of the expected width.

In the specific embodiment herein shown the various pulse widths and their corresponding windows are shown in the following tabulations:

| Pulse No. | Pulse Width(ms) | Pulse Window(ms) | Difference(ms) |
| --- | --- | --- | --- |
| 1 | 130 | 100–160 | 60 |
| 2 | 190 | 160–220 | 60 |
| 3 | 250 | 220–280 | 60 |
| 4 | 315 | 280–345 | 65 |
| 5 | 380 | 345–410 | 65 |
| 6 | 445 | 410–475 | 65 |
| 7 | 510 | 475–540 | 65 |
| 8 | 580 | 540–610 | 70 |
| 9 | 650 | 610–680 | 70 |

-continued

| Pulse No. | Pulse Width(ms) | Pulse Window(ms) | Difference(ms) |
| --- | --- | --- | --- |
| 10 | 720 | 680–750 | 70 |

The discussion just concluded postulated that the dividing rate of the counter 33 begins at 12. In accordance with one aspect of the present invention the counter 33 accepts binary input data such that its four inputs 44, 45, 46 and 47 correspond respectively to the numbers 8, 4, 2 and 1. The purpose of these inputs is to control the divisor of the counter 33. Until the shift is to the fourth stage of the shift register 27 the inputs 44 and 45 dictate a divisor of 12, for example. When the shift is to stages four through seven inclusive, the divide rate is 13 as prescribed by the additional input 47. When the shift is to stages eight through 10 the divide rate is 14 as prescribed by the additional input 46.

When the shift is to the fourth through the seventh stages, inclusive, feedback data are applied from the shift register to input 47 of the counter via OR gate 48. Similarly, when the shift is to stages eight through 10 of the shift register 27 the data are applied to input 46 via OR gate 49.

The divisor is shifted so that tolerances may be widened and the windows or acceptable ranges widened as the input pulses increase in width. Thus, as to the shift is to the increasingly higher groups of stages the divisor of counter 33 is increased, cutting down the rate of locally generated pulse application, to the input of the shift register 27, per input pulses on line 31.

The shift register 27 has 10 outputs 34–43 corresponding to its 10 stages and to the pulse number designations utilized in the foregoing table.

For the purpose of reading out the shift register 27 at the termination of any input pulse, I provide a 10 stage gate circuit 50, which is essentially a single throw ten-pole switch, normally in the open condition. This switch has 10 inputs lettered $a$ through $j$, corresponding to the ten outputs of the shift register 27, numbered 34–43 inclusive. This gate circuit 50 samples all of the outputs of the shfit register at the time of the conclusion of the applied input signal pulse.

For the purpose of activating the 10 stage gate circuit or sampler 50 I provide a differentiating circuit 51 which is cascaded with an inverter 52 and a one-shot multivibrator 53 between line 10 and set input 54 of the sampler 50. The operation of this circuitry is such that a positive going spike produced at the initiation of the applied pulse at input 10 is of no significance but the negative going spike produced, at the end of the signal pulse applied at input 10, by differentiating circuit 51 is reversed in polarity by inverter 52 and utilized to trigger one-shot multivibrator 53, which in turn activates the sampling unit 50, so that the readout occurs and so that the operator is supplied with digital data indicating to him the width of the pulse applied at input 10, all as indicated in the foregoing tabulation.

When the one-shot multivibrator 53 concludes the generation of its pulse then the cycle of operation is substantially completed and it is desired to reset the system to the conditions which prevailed before the application of any signal pulse at input 10. Accordingly I provide a second network comprising a differentiating circuit 55 and an inverter 56 and a one-shot multivibrator 57, all in cascade between the one-shot multivibrator 55 and the reset input 58 to the shift register 27. Again, the positive going spike produced by differentiator 55 is of no significance but the negative going spike which occurs at the termination of the pulse produced by multivibrator 53 is inverted by inverter 56 and utilized to trigger a one-shot multivibrator 57 which activates the reset input 58 to the shift register. This multivibrator 57 further activates reset inputs 59, 60 and 61 to the divide-by-N counter 33 and divide-by-20 counter 16 and flip-flop 19, respectively.

Having described the construction of a preferred embodiment of the invention I shall now go through a cycle of operation.

Figure 3:
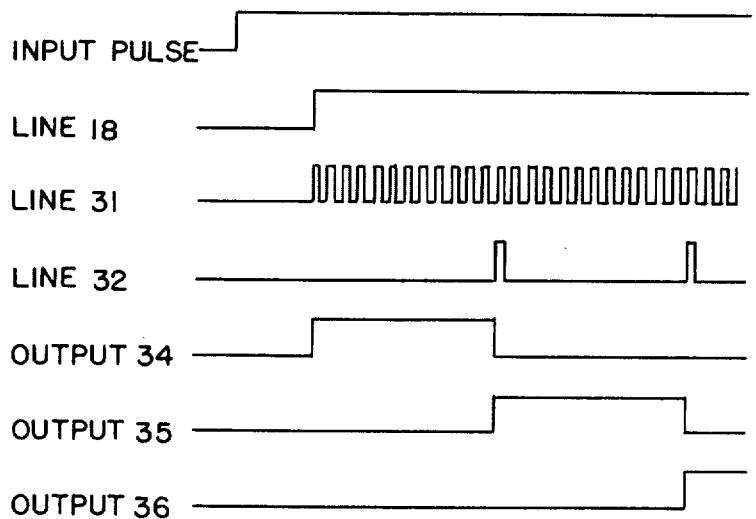
FIG. 3 is a set of curves used in explaining the operation of the FIG. 2 embodiment.

Referring to FIGS. 2 and 3 the input signal pulse is applied by line 10 to an input of gate 11. Gates 11 and 12 and their immediately associated elements form an oscillator which has a period of oscillation of 5 milliseconds. The output of that oscillator, active when the input pulse is high, is applied to the input of counter 16. Counter 16 will output one pulse at 18 for every 20 pulses received at input 17. Output 18 is further applied to input 22 of gate 23. Input 24 of gate 23 is high so that the pulse at 18 is supplied to set input 26 of the shift register 27, causing shift register 27 to be preset 100 milliseconds after the input is applied at 10. This corresponds to the beginning of the window for the narrowest acceptable pulse.

Output 18 of counter 16 is also applied to an input of flip-flop 19 so that at the 100 millisecond point output 20 goes high and satisfies gate 29 so that pulses are applied to the programmable divide-by-N counter 33 from line 17.

The inputs 44, 45, 46 and 47 of counter 33 are used to specify the count rate. Inputs 44–47 accept binary data such that they, respectively, correspond to binary $2^3$, $2^2$, $2^0$, $2^1$ or 8, 4, 1, 2. The output of counter 33 appears on line 32. When inputs 44 and 45 are high and 46 and 47 are low a binary 12 (i.e., 1100) is applied to counter 33. This means that on every twelfth input pulse at 31, one output pulse at 32 will be produced. Because one input pulse is applied at 31 every 5 milliseconds, the output pulse at 32 will appear every 60 milliseconds. When the input lines to counter 33 indicate a binary 12 the output pulse at 32 occurs every 60 milliseconds. When the input date to counter 33 constitute a binary 13 or 14, the output pulse at 32 occurs every 65 or 70 milliseconds, respectively.

The shift register 27 has 10 stages, so that each stage corresponds to one of the input widths shown in the foregoing table. For example, output 34 corresponds to pulse width No. 1. This output is set to a high at 100 milliseconds by the action of input 26. This high will be shifted from one stage to the next by the action of the clock input 32. Outputs O, P, Q, R which correspond to pulse widths Nos. 4–7 are applied to OR gate 48 so that when the high is shifted into these stages a high will be applied to input 47 so that counter 33 will divide by 13. This provides the 65 millisecond windows or time bins for signal pulse widths Nos. 4–7. Outputs S, T, U of counter 33 are applied to OR gate 49 so that a binary 14 will be applied to counter 33 when any of the corresponding stages of the register 27 is high. This corresponds to the windows for signal pulse widths Nos. 8–10. When the signal input pulse ceases at line 10 the output of register 27 which is high corresponds to the signal input pulse width.

While there has been shown and described what is at present considered to be the preferred embodiment of the invention, various changes and modifications, all within the scope of the invention, will be apparent to those of skill in the art. Accordingly it is intended to cover in the appended claims all such modifications and changes as are within the proper scope of the invention.

I claim:

1. A wave form acceptance system for the measurement of the time duration of input signal wave forms with a relatively wide time-duration range comprising:

local pulse-generating means having a wave form input circuit and actuated by input signal wave forms for generating pulses, having a cycle relatively short compared to the input signal, throughout the duration of said input signal, means for establishing a series of time bins, means for coupling the local pulse generating means to the bin establishing means to supply locally generated pulses to be counted, the bin established being a measure of the pulse count and a function of the duration of said input signal, the coupling means comprising a divider counter having divisor-adjusting means and an input coupled to the local pulse generating means and an output coupled to the bin establishing means, a feedback coupling between the bin establishing means and the divisor-adjusting means for varying the divisor to vary the number of locally generated pulses required to shift the bin-establishing means to the next bin, and means for delaying the supply of locally generated pulses to be counted for a time equal to the lower time boundary of the shortest time bin which is established.

2. A wave form acceptance system in accordance with claim 1 in which the means for establishing a series of time bins is a shift register having a plurality of groups of stages.

* * * * *